US012581997B2

(12) United States Patent
Francis et al.

(10) Patent No.: US 12,581,997 B2
(45) Date of Patent: Mar. 17, 2026

(54) LIGHT-EMITTING DIODE PACKAGES WITH DIRECTIONAL EMISSION INTENSITY AND COLOR UNIFORMITY

(71) Applicant: CreeLED, Inc., Durham, NC (US)

(72) Inventors: Aaron Francis, Apex, NC (US); Derek Miller, Columbus, OH (US)

(73) Assignee: CreeLED, Inc., Durham, NC (US)

( * ) Notice: Subject to any disclaimer, the term of this patent is extended or adjusted under 35 U.S.C. 154(b) by 1023 days.

(21) Appl. No.: 17/657,236

(22) Filed: Mar. 30, 2022

(65) Prior Publication Data

US 2023/0317686 A1 Oct. 5, 2023

(51) Int. Cl.
*H01L 25/075* (2006.01)
*H10H 20/851* (2025.01)
*H10H 20/857* (2025.01)

(52) U.S. Cl.
CPC ..... *H01L 25/0753* (2013.01); *H10H 20/8512* (2025.01); *H10H 20/857* (2025.01)

(58) Field of Classification Search
CPC ............ H01L 25/0753; H10H 20/8512; H10H 20/857; H10H 20/882; H10H 20/854; H10H 20/853; H10H 20/851
See application file for complete search history.

(56) References Cited

U.S. PATENT DOCUMENTS

2018/0033924 A1*  2/2018  Andrews ............. H01L 25/0753
2021/0328112 A1  10/2021  McFarlane et al.
2022/0052232 A1*  2/2022  Miller ................ H10H 20/8512

OTHER PUBLICATIONS

Author Unknown, "High-Power LRD—WICOP-22 & 22P," Product Data Sheet, Revision 1.4, Mar. 15, 2022, Seoul Semiconductor, 30 pages.
Author Unknown, "Luxeon Rubix," Product Datasheet, Jan. 21, 2022, Lumileds Holding B.V., 33 pages.
Author Unknown, "XLamp XD16 LEDs," Product Family Data Sheet CLD-DS177, Revision 3A, Cree LED, accessed Mar. 17, 2022, 36 pages.

* cited by examiner

*Primary Examiner* — William B Partridge
*Assistant Examiner* — Chevy J Boegel
(74) *Attorney, Agent, or Firm* — Withrow & Terranova, P.L.L.C.

(57) ABSTRACT

Light-emitting diode (LED) packages and more particularly LED packages with directional emission intensity and color uniformity are disclosed. LED packages include one or more LED chips on a submount with arrangements of light-altering materials and lumiphoric material layers that provide directional light emissions with improved color over angle uniformity. Light-altering materials are provided that cover sidewalls of LED chips while lumiphoric material layers cover LED chips and light-altering materials. Such LED packages may avoid the need to include encapsulation materials and/or lenses that would otherwise cover the lumiphoric material layers. As such, exterior light-exiting faces of LED packages are formed by surfaces of lumiphoric material layers.

14 Claims, 4 Drawing Sheets

LIGHT-EMITTING DIODE PACKAGES WITH DIRECTIONAL EMISSION INTENSITY AND COLOR UNIFORMITY

FIELD OF THE DISCLOSURE

The present disclosure relates to light-emitting diode (LED) packages and more particularly to LED packages with directional emission intensity and color uniformity.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, indium phosphide, aluminum nitride, gallium arsenide-based materials, and/or from organic semiconductor materials. Photons generated by the active region are initiated in all directions.

Lumiphoric materials, such as phosphors, may be arranged in light emission paths of LED emitters to convert portions of light to different wavelengths. LED packages have been developed that can provide mechanical support, electrical connections, and encapsulation for LED emitters. Light emissions that exit surfaces of LED emitters typically interact with various elements or surfaces of the LED package and lumiphoric materials before exiting, thereby increasing opportunities for light loss and potential non-uniformity of light emissions. As such, there can be challenges in producing high quality light with desired emission characteristics while also providing high light emission efficiency in LED packages.

The art continues to seek improved LEDs and solid-state lighting devices having desirable illumination characteristics capable of overcoming challenges associated with conventional lighting devices.

SUMMARY

Aspects disclose herein relate to light-emitting diode (LED) packages and more particularly to LED packages with directional emission intensity and color uniformity. LED packages include one or more LED chips on a submount with arrangements of light-altering materials and lumiphoric material layers that provide directional light emissions with improved color over angle uniformity. Light-altering materials are provided that cover sidewalls of LED chips while lumiphoric material layers cover LED chips and light-altering materials. Such LED packages may avoid the need to include encapsulation materials and/or lenses that would otherwise cover the lumiphoric material layers. As such, exterior light-exiting faces of LED packages are formed by surfaces of lumiphoric material layers.

In one aspect, an LED package comprises: a submount; at least one LED chip on the submount, the at least one LED chip including a first side, a second side that is mounted to the submount, and peripheral edges that bound the first side and the second side; a light-altering material on the peripheral edges of the at least one LED chip and on portions of the submount that are adjacent the at least one LED chip; and a lumiphoric material layer on the at least one LED chip and the light-altering material, wherein a surface of the lumiphoric material layer forms an exterior light-exiting face for the LED package. In certain embodiments, the lumiphoric material layer, the light-altering material, and the submount collectively form a peripheral edge of the LED package. In certain embodiments, the lumiphoric material layer comprises a thickness of no more than 150 microns ($\mu$m), or in a range from 50 $\mu$m to 100 $\mu$m. In certain embodiments, a perpendicular distance from the first side of the LED chip to the exterior light-exiting face is no more than 100 microns ($\mu$m), or in a range from 50 $\mu$m to 100 $\mu$m. In certain embodiments, the light-altering material covers the peripheral edges of the at least one LED chip. In certain embodiments, a height of the light-altering material above the peripheral edges of the at least one LED chip. In certain embodiments, the submount decreases in a lateral direction away from the peripheral edges of the at least one LED chip. In certain embodiments, the lumiphoric material layer extends on a portion of the light-altering material with the height that decreases in the lateral direction away from the peripheral edges of the at least one LED chip such that a portion of the lumiphoric material layer is closer to the submount than the first side of the at least one LED chip. In certain embodiments, the lumiphoric material layer comprises phosphor particles in a binder with a volume percentage of phosphor particles in a range from 25% to 45%. In certain embodiments, the exterior light-exiting face for the LED package is configured to form an interface with an ambient atmosphere that is separate from the LED package.

In another aspect, an LED package comprises: a submount comprising a first side and a second side that opposes the first side, the first side comprising metal traces, and the second side comprising package bond pads that are electrically coupled to the metal traces; at least one LED chip including a first side and a second side that is mounted on and electrically coupled to the metal traces; and a lumiphoric material layer on the at least one LED chip such that a surface of the lumiphoric material layer forms an exterior light-exiting face for the LED package and a perpendicular distance from the first side of the LED chip to the exterior light-exiting face is no more than 100 $\mu$m. In certain embodiments, the perpendicular distance from the first side of the LED chip to the exterior light-exiting face is in a range from 50 $\mu$m to 100 $\mu$m. The LED package may further comprise a light-altering material on portions of the submount that are adjacent the at least one LED chip, wherein the light-altering material is arranged between the lumiphoric material layer and the submount. In certain embodiments, a height of the light-altering material above the submount decreases in a lateral direction away from the at least one LED chip. In certain embodiments, the lumiphoric material layer extends on a portion of the light-altering material with the height that decreases in the lateral direction away from the at least one LED chip such that a portion of the lumiphoric material layer is closer to the submount than the first side of the at least one LED chip. In certain embodiments, a total height of the LED package as measured from a mounting surface of the package bond pads to the exterior light-exiting face is no more than 900 μm, or in a range from 600 μm to 800 μm. In certain embodiments, the exterior light-exiting face for the LED package is configured to form an interface with an ambient atmosphere that is separate from the LED package. In certain embodiments, the lumiphoric material layer comprises phosphor particles in a binder with a volume percentage of phosphor particles in a range from 25% to 45%.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
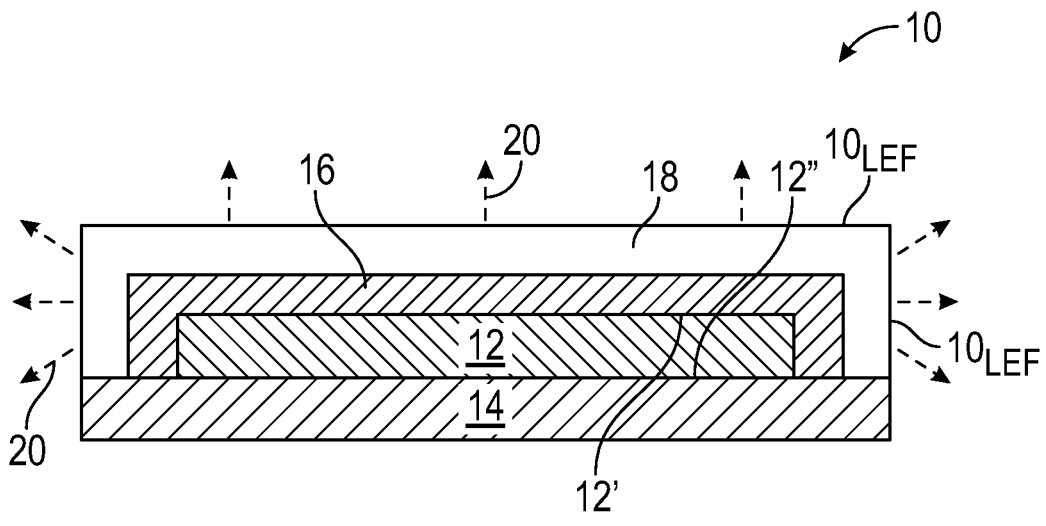
FIG. 1 is a cross-sectional view of a typical light-emitting diode (LED) package that includes an LED chip on a submount.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Aspects disclose herein relate to light-emitting diode (LED) packages and more particularly to LED packages with directional emission intensity and color uniformity. LED packages include one or more LED chips on a submount with arrangements of light-altering materials and lumiphoric material layers that provide directional light emissions with improved color over angle uniformity. Light-altering materials are provided that cover sidewalls of LED chips while lumiphoric material layers cover LED chips and light-altering materials. Such LED packages may avoid the need to include encapsulation materials and/or lenses that would otherwise cover the lumiphoric material layers. As such, exterior light-exiting faces of LED packages are formed by surfaces of lumiphoric material layers.

Before delving into specific details of various aspects of the present disclosure, an overview of various elements that may be included in exemplary LEDs of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), indium phosphide (InP), and related compounds.

The active LED structure may be grown on a growth substrate that can include many materials, such as sapphire, SiC, aluminum nitride (AlN), GaN, GaAs, glass, or silicon. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm. In certain embodiments, the active LED structure may be configured to emit light that is outside the visible spectrum, including one or more portions of the ultraviolet (UV) spectrum.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, spectral density, etc. In certain embodiments, aggregate emissions of LED chips, optionally in combination with one or more lumiphoric materials, may be arranged to provide cool white, neutral white, or warm white light, such as within a color temperature range of 2500 Kelvin (K) to 10,000 K. In certain embodiments, lumiphoric materials having cyan, green, amber, yellow, orange, and/or red peak wavelengths may be used. In certain embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{1-x-y}Sr_xEu_yAlSiN_3$) emitting phosphors, and combinations thereof. In other embodiments, the LED chip and corresponding lumiphoric material may be configured to primarily emit converted light from the lumiphoric material so that aggregate emissions include little to no perceivable emissions that correspond to the LED chip itself.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, lumiphoric materials may be provided over one or more surfaces of LED chips, while other surfaces of such LED chips may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) may be coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In certain embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In other embodiments, an active LED structure may be bonded to a carrier submount, and the growth substrate may be removed such that light may exit the active LED structure without passing through the growth substrate.

According to aspects of the present disclosure, LED packages may include one or more elements, such as lumiphoric materials and electrical contacts, among others, that are provided with one or more LED chips on a support member, such as a submount or a lead frame. Suitable materials for the submount include, but are not limited to, ceramic materials such as aluminum oxide or alumina, AlN, or organic insulators like polyimide (PI) and polyphthalamide (PPA). In other embodiments, a submount may comprise a printed circuit board (PCB), sapphire, Si or any other suitable material. For PCB embodiments, different PCB types can be used such as standard FR-4 PCB, metal core PCB, or any other type of PCB. In still further embodiments, the support structure may embody a lead frame structure. Light-altering materials may be arranged within LED packages to reflect or otherwise redirect light from the one or more LED chips in a desired emission direction or pattern.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index or refraction that is configured to refract light emissions in a desired direction. In certain aspects, light-reflective particles may also be referred to as light-scattering particles. A weight ratio of the light-reflective particles or scattering particles to a binder may comprise a range of about 0.15:1 to about 0.5:1, or in a range of about 0.5:1 to about 1:1, or in a range of about 1:1 to about 2:1, depending on a desired viscosity before curing. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque color, such as black or gray for absorbing light and increasing contrast. In certain embodiments, the light-altering material includes both light-reflective material and light-absorbing material suspended in a binder.

Embodiments of the present disclosure are applicable to LED packages that include multiple LED chips clustered together to provide increased light output and/or the capability for a single LED package to emit multiple colors and/or peak wavelengths of light. Relative sizes or areas of individual LED chips within an LED package may be selected according to desired emission intensities and profiles. In certain embodiments, the LED chips within an LED package may have smaller sizes such as 0.5 millimeters (mm) by 0.5 mm and/or larger sizes such as 2 mm by 2 mm, or other ranges from 0.5 mm by 0.5 mm to 1 mm by 1 mm. In certain embodiments, a longest lateral dimension of each LED chip may be in a range from 0.5 mm to 2 mm, or in a range from 1 mm to 2 mm, or in a range from 0.5 mm to 1 mm. In such ranges where at least one dimension is 0.5 mm and greater, the LED chips may be well suited for providing high output powers in a compact footprint.

Despite advances in LED packaging technology, challenges remain in directing light emissions from LED chips and/or lumiphoric materials in desired directions with increased efficacy and suitable color uniformity. Light emissions that are generated within active regions of LEDs and wavelength-converted light from lumiphoric materials may be omnidirectional in nature. In this regard, light may attempt to exit all sides of an LED chip within a package, thereby contributing to emission patterns with intensities that vary over wide emission angles. Additionally, laterally emitted light may interact differently with lumiphoric materials to contribute to reduced color over angle uniformity. According to aspects of the present disclosure, light-altering material arrangements are provided proximate to peripheral edges or sidewalls of LED chips that redirect laterally emitted light in desired light-emitting directions, such as toward a top surface of the LED chip that is opposite a mounting surface for the LED chip. In this manner, such light-altering material arrangements may provide a two-dimensional light-emitting surface for LED chips, rather than three-dimensional light-emitting surfaces when light is allowed to exit LED chip sidewalls. According to further aspects of the present disclosure, lumiphoric material arrangements are provided in such a manner that allows traditional encapsulation layers and/or lenses to be omitted. In this regard, a surface of a lumiphoric material is configured to form an exterior light-exiting surface for the LED package. By providing such lumiphoric material arrangements, light from LED chips may pass through fewer interfaces and travel shorter distances when exiting the package, thereby providing enhanced directional light intensity and color uniformity.

FIG. 1 is a cross-sectional view of a typical LED package 10 that includes an LED chip 12 on a submount 14. The LED chip 12 further includes a lumiphoric material layer 16 that covers the LED chip 12 on the submount 14. In this regard, a first side 12' of the LED chip 12 may be provided adjacent or closer to the lumiphoric material layer 16 while a second side 12" of the LED chip 12 is mounted to the submount 14. The LED chip 12 further includes an encapsulation layer 18 that is light-transmissive or light-transparent to wavelengths of light from the LED chip 12 and the lumiphoric material layer 16. The encapsulation layer 18 is typically arranged to provide environmental protection for the underlying elements of the LED package 10 and, in certain applications, a shape of the encapsulation layer 18 may be configured to shape light emission patterns from the LED package 10. A typical material for the encapsulation layer 18 may be silicone or a resin. As illustrated by the arrows of FIG. 1, light 20 exits the LED package 10 through surfaces of the encapsulation layer 18. In this manner, the outer surfaces of the encapsulation layer form exterior light-exiting faces $10_{LEF}$ for the LED package 10.

With such an arrangement, portions of the light 20 generated by the LED chip 12 must pass through at least a first internal interface formed between the LED chip 12 and the lumiphoric material layer 16 and a second internal interface formed between the lumiphoric material layer 16 and the encapsulation layer 18 before reaching the exterior light-exiting faces $10_{LEF}$. Additionally, portions of the light 20 that are subject to wavelength conversion within the lumiphoric material layer 16 must pass through at least the above-described second internal interface before reaching the exterior light-exiting faces $10_{LEF}$. At each internal interface or the exterior light-exiting faces $10_{LEF}$, the light 20 has an opportunity to reflect or refract away from a desired emission direction that is normal to the surface of the submount 14 on which the LED chip 12 is mounted. Additionally, a near field emission intensity of the light 20 can be relatively high at higher emission angles, such as greater than 60 degrees from a line perpendicular to the surface of the submount 14 on which the LED chip 12 is mounted. In this manner, a significant portion of light may laterally escape the LED package 10. Furthermore, such laterally emitted light may have reduced color mixing of light from the LED chip 12 and the lumiphoric material layer 16.

Figure 2:
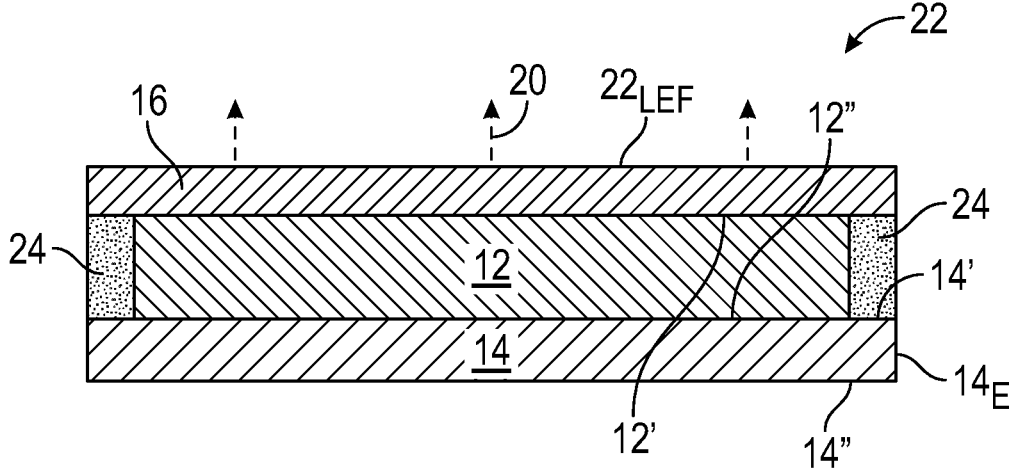
FIG. 2 is a cross-sectional view of an LED package that is devoid of typical encapsulation layers such that a surface of a lumiphoric material layer forms an exterior light-exiting face for the LED package.

FIG. 2 is a cross-sectional view of an LED package 22 that is devoid of typical encapsulation layers such that a surface of the lumiphoric material layer 16 forms an exterior light-exiting face $22_{LEF}$ for the LED package 22. As illustrated, the LED package 22 includes the LED chip 12 on a first side 14' of the submount 14 that is opposite a second side 14" of the submount 14. The LED chip 12 may be provided such that a lateral width of the LED chip 12 is less than a corresponding lateral width of the submount 14. A light-altering material 24, such as a light-reflecting and/or light refracting material as described above, may be arranged on portions of the submount 14 that are adjacent the LED chip 12. In certain embodiments, the light-altering material 24 may be arranged to extend all the way to peripheral edges 14E of the submount 14. In still further embodiments, the light-altering material 24 may cover all surfaces of the first side 14' of the submount 14 that are outside the LED chip 12. In this manner, laterally-emitted light from the LED chip 12 may be redirected toward a desired emission direction for the LED package 22 that is along a perpendicular direction from the first side 14' of the submount 14. In doing so, challenges associated with color mixing uniformity along package edges may be improved.

As further illustrated in FIG. 2, the lumiphoric material layer 16 is arranged on the LED chip 12 and the light-altering material 24. In this manner, the lumiphoric material layer 16 is arranged to cover the LED chip 12 and laterally extend across portions of the light-altering material 24 adjacent to the LED chip 12. In certain embodiments, the lumiphoric material layer 16 may be arranged to laterally extend all the way to the peripheral edges 14E of the submount 14 in a similar manner as the light-altering material 24. In this regard, the light-altering material 24 may be arranged between the lumiphoric material layer 16 and the submount 14. Additionally, portions of the lumiphoric material layer 16, the light-altering material 24, and the submount 14 may collectively form a peripheral edge of the LED package 22. Such an arrangement may be provided by mounting a plurality of LED chips 12 across a larger submount panel, applying the light-altering material 24 along portions of the submount panel outside the LED chips 12, and applying the lumiphoric material layer 16 to cover the LED chips 12 and the light-altering material 24. In certain aspects, the lumiphoric material layer 16 may include lumiphoric particles in a binder that is spray-coated, dispensed, or otherwise applied to the LED chips before curing of the binder. Individual LED packages 22 may be formed by a singulating or dicing step that separates the larger submount panel into individual packages.

By omitting typical encapsulation layers that would be above the lumiphoric material layer 16, the exterior light-exiting face $22_{LEF}$ for the LED package 22 is provided by a surface of the lumiphoric material layer 16, thereby reducing a number of interfaces that light 20 must pass through before exiting the LED package 22. The exterior light-exiting face $22_{LEF}$ may thereby form an interface between the LED package 22 and a surrounding environment that is separate from the LED package 22. For example, the surrounding environment may embody an open ambient atmosphere that is exposed for indoor and/or outdoor environments or an enclosed and/or partially enclosed ambient atmosphere that is within another device, such as a portion of a lighting fixture in which the LED package 22 is arranged. By extending the lumiphoric material layer 16 all the way to the peripheral edges 14E of the submount 14, the exterior light-exiting face $22_{LEF}$ may thereby be extended across the entire submount 14. Typical encapsulation layers would provide environmental protection for underlying elements of the LED package 22. By having the lumiphoric material layer 16 form the exterior light-exiting face $22_{LEF}$, the lumiphoric material layer 16 itself may be configured to provide the environmental protection along with wavelength conversion.

In certain embodiments, the lumiphoric material layer 16 may comprise lumiphoric particles within a binder material, with a specific example being phosphor particles within a binder material of silicone or resin. When spray-coated or dispensed as described above, the distribution of lumiphoric particle sizes may form an uneven or bumpy surface for lumiphoric material layers. These uneven surfaces are typically covered by encapsulation layers since if exposed, the uneven surfaces could promote handing failures when contacted. According to principles of the present disclosure, a loading of lumiphoric particles relative to a binder material for the lumiphoric material layer 16 may be configured to provide suitable wavelength conversion while also forming a smooth upper surface of the lumiphoric material layer 16. This smooth upper surface corresponds with the exterior light-exiting face $22_{LEF}$ of the LED package 22. By forming the smooth upper surface of the lumiphoric material layer 16, the LED package 22 may be more mechanically robust to provide the environmental protection typically provided by encapsulation layers.

In certain embodiments, the loading may comprise a weight ratio of lumiphoric particles to the binder material that is in a range from 1.5 to 2.5. In specific examples, a weight ratio of 1.5 may correspond with the lumiphoric material layer 16 having a volume of 29% lumiphoric particles to 71% binder material, or a weight that is 60% lumiphoric materials and 40% binder material. A weight ratio of 2.5 may correspond with the lumiphoric material layer having a volume of 41% lumiphoric particles to 59% binder material, or a weight that is 71% lumiphoric materials and 28% binder material. In certain embodiments, the lumiphoric material layer 16 may include a volume percentage of lumiphoric particles in a range from 25% to 45% or a weight percentage of lumiphoric particles in a range from 55% to 75% to provide a smooth upper surface for the exterior light-exiting face $22_{LEF}$. Higher loading of lumiphoric particles may contribute to the uneven surfaces described above, while lower loading may not provide suitable wavelength conversion without having to substantially increase a thickness of the lumiphoric material layer 16. In certain embodiments, a thickness of the lumiphoric material layer 16 as measured from the LED chip 12 may be no more than 150 microns (μm), or no more than 100 μm, or in a range from 50 μm to 100 μm. In this regard, a perpendicular distance from the first side 12' of the LED chip 12 to the exterior light-exiting face $22_{LEF}$ may be no more than 150 μm, or no more than 100 μm, or in a range from 50 μm to 100 μm in certain embodiments. As such, a portion of the lumiphoric material layer 16 may form the exterior light-exiting face $22_{LEF}$ of the LED package 22, while still maintaining an overall slim profile for the LED package 22. In combination with the arrangement of the light-altering material 24, the LED package 22 may exhibit increased light emissions with improved color uniformity compared with the LED package 10 of FIG. 1. In certain embodiments, the thickness values described above for the lumiphoric material layer 16 may be no more than 100 μm for overall emission targets with color temperatures in the 2700 K to 7000 K range, while thickness values of no more than 150 μm may be well suited for color temperatures below 2700 K, such as in a range from 1800 K to 2400 K. In still further embodiments, saturated emissions where a substantial majority of emissions are provided from wavelength conversion in the lumiphoric material layer 16 may have thickness values for the lumiphoric material layer 16 of no more than 150 μm. By way of example, an embodiment with saturated emissions for the LED package 22 may include the LED chip 12 being configured to provide blue emissions and the lumiphoric material layer 16 being configured to covert a substantial majority of the blue emissions, such as greater than 90%, or greater than 95%, or greater than 99%, to another color, such as amber.

Figure 3:
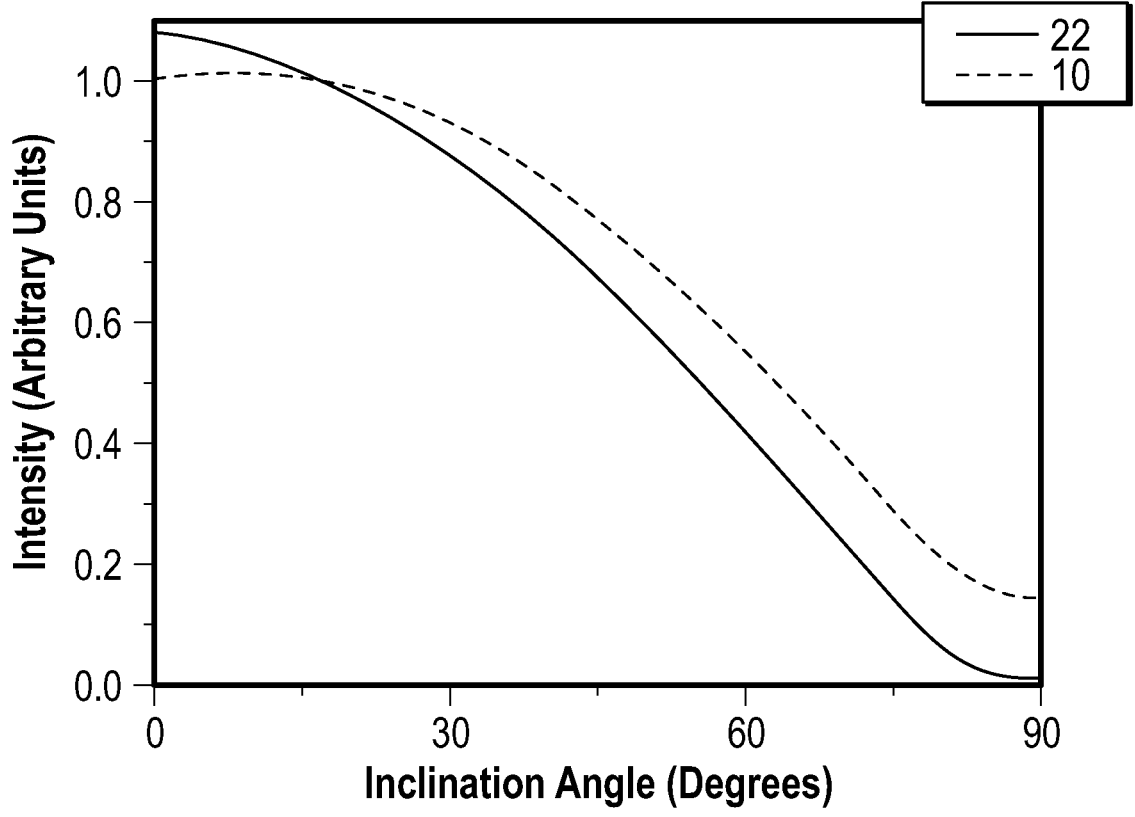
FIG. 3 is plot comparing near field emission intensity vs. inclination angle for the LED package of FIG. 1 and the LED package of FIG. 2.

FIG. 3 is plot comparing near field emission intensity vs. inclination angle for the LED package 10 of FIG. 1 and the LED package 22 of FIG. 2. The y-axis represents light intensity in arbitrary units and the x-axis represents inclination angle as measured from a direction that is normal to a center of the first side 12' of the LED chip 12 of FIGS. 1 and 2. A 0° inclination angle corresponds to light intensity along the direction normal to the first side 12' while a 90° inclination angle corresponds with light intensity laterally emitted along edges of the LED package (10 or 22) along a direction that is parallel to the first side 12'. As illustrated, the LED package 22 of FIG. 2 exhibits increased light intensity for inclination angles below about 15°, while the LED package 10 exhibits increased lateral emissions. In this regard, the arrangement of the lumiphoric material layer 16 as the exterior light-exiting face $22_{LEF}$ of the LED package 22 in combination with the light-altering material 24 of FIG. 2 provides improved directional emission intensity.

Figure 4:
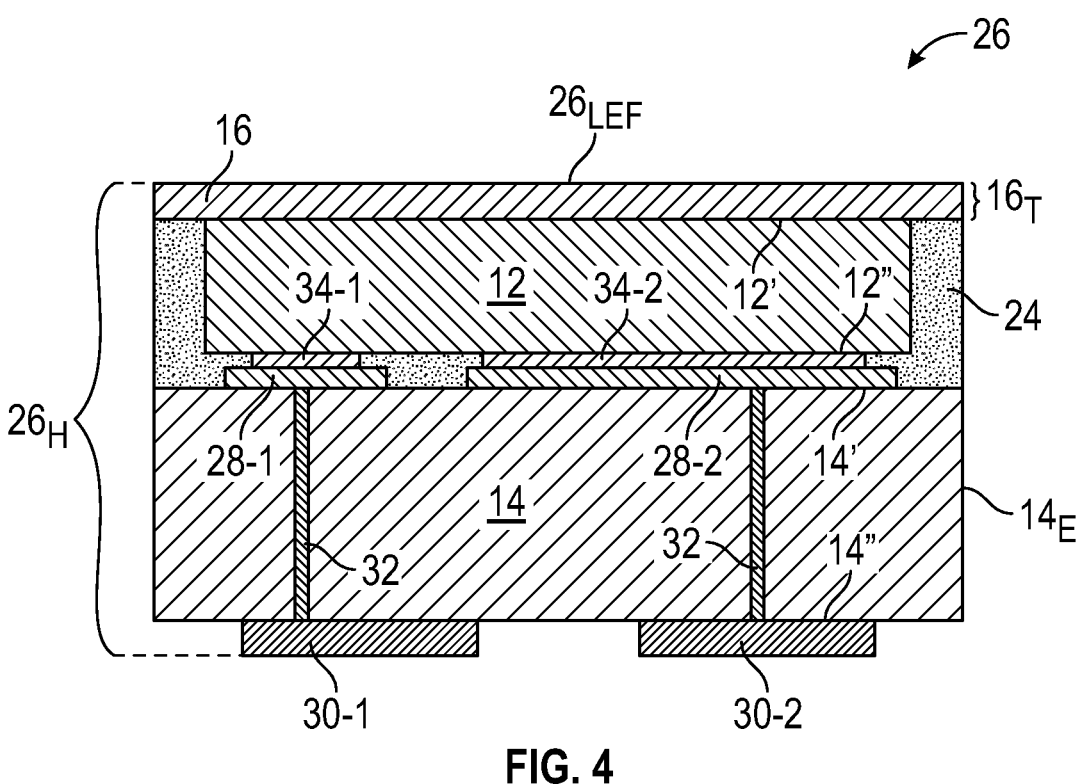
FIG. 4 is a cross-sectional view of an LED package that is similar to the LED package of FIG. 2 with an electrical connection arrangement between the LED chip and the submount.

FIG. 4 is a cross-sectional view of an LED package 26 that is similar to the LED package 22 of FIG. 2 with an electrical connection arrangement between the LED chip 12 and the submount 14. The first side 14' of the submount 14 may include a number of metal traces 28-1 to 28-2, and the second side 14" of the submount 14 may include a number of package bond pads 30-1 to 30-2 that are electrically coupled to the metal traces 28-1 to 28-2. In certain embodiments, a number of electrically conductive vias 32 may extend through the submount 14 to electrically couple the package bond pads 30-1 to 30-2 to the metal traces 28-1 to 28-2. First and second contacts 34-1 to 34-2 of the LED chip 12 may be electrically coupled to respective ones of the metal traces 28-1 to 28-2. As such, the first contact 34-1, the metal trace 28-1, one or more of the electrically conductive vias 32, and the package bond pad 30-1 may form an electrically conductive anode path while the second contact 34-2, the metal trace 28-2, one or more of the electrically conductive vias 32, and the package bond pad 30-2 may form an electrically conductive cathode path. In other embodiments, the order of the anode and cathode paths may be reversed. As illustrated in FIG. 4, the first and second contacts 34-1 to 34-2 may be arranged on the second side 12" of the LED chip 12 such that the LED chip 12 may embody a flip-chip LED that is flip-chip mounted and electrically coupled with the metal traces 28-1 to 28-2. In other embodiments, the LED chip 12 may embody other geometries such that wire bond connections are employed between the LED chip 12 and the metal traces 28-1 to 28-2. As previously described, the lumiphoric material layer 16 may form an exterior light-exiting face $26_{LEF}$ of the LED package 26 and in combination with the light-altering material 24, improved directional emission intensity and uniformity may be achieved. A thickness 16T of the lumiphoric material layer 16 as measured from the LED chip 12 may be no more than 100 µm or in a range from 50 µm to 100 µm as previously described. Depending on dimensions of the submount 14 and LED chip 12, a total height $26_H$ of the LED package 26 as measured from a mounting surface of the package bond pads 30-1 to 30-2 to the exterior light-exiting face $26_{LEF}$ may be no more than 900 µm or in a range from 600 µm to 800 µm.

Figure 5:
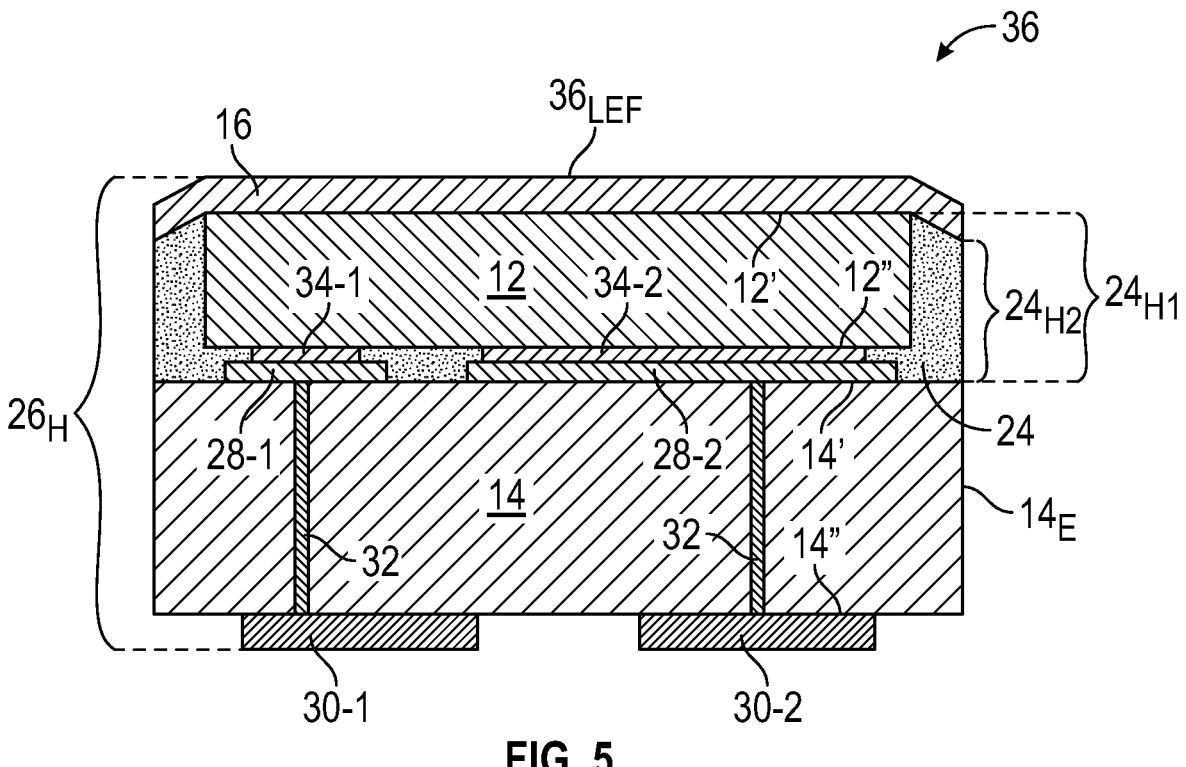
FIG. 5 is a cross-sectional view of an LED package that is similar to the LED package of FIG. 4 for embodiments where the light-altering material covers peripheral sidewalls of the LED chip and has a height that decreases in a lateral direction away from the LED chip.

FIG. 5 is a cross-sectional view of an LED package 36 that is similar to the LED package 26 of FIG. 4 for embodiments where the light-altering material 24 covers peripheral sidewalls of the LED chip 12 and has a height that decreases in a lateral direction away from the LED chip 12. In certain embodiments, the light-altering material 24 may be arranged with a top surface that is sloped in a direction away from the LED chip 12. For example, the light-altering material 24 may be applied by dispensing in such a way that the peripheral edges of the LED chip 12 are covered while a height of the light-altering material 24 above the submount 14 decreases in a lateral direction away from the peripheral edges of the LED chip 12. As illustrated, a first height $24_{H1}$ of the light-altering material 24 is at or near a height of the first side 12' of the LED chip 12 above the submount 14 while a second height $24_{H2}$ of the light-altering material 24 is less than the first height $24_{H1}$. This arrangement may be accomplished by selection of a viscosity of the light-altering material 24 before curing and from surface tension with the peripheral edges of the LED chip 12 while the remainder of the light-altering material 24 settles to a lower height. In this regard, formation of the light-altering material 24 along the first side 12', or top surface, of the LED chip 12 may be discouraged. In such embodiments, the light-altering material 24 may be formed with reduced lateral thickness, particularly in regions at or near the first side 12' of the LED chip 12, and some laterally propagating light in these regions may escape the light-altering material 24 without being redirected. As illustrated, the lumiphoric material layer 16 is arranged to extend on portions of the light-altering material 24 between the first height $24_{H1}$ and the second height $24_{H2}$ such that a portion of the lumiphoric material layer 16 is closer to the submount 14 than the first side 12' of the LED chip 12. In this regard, any light that may escape the reduced lateral thickness regions of the light-altering material 24 may be subject to wavelength conversion, thereby improving color over angle emission uniformity.

In alternative embodiments, the LED package 26 of FIG. 4 or the LED package 36 of FIG. 5 may be configured to provide monochromatic emissions. In such embodiments, the lumiphoric material layer 16 may be omitted such that the first side 12' of the LED chip 12 forms the exterior light-exiting face ($26_{LEF}$ or $36_{LEF}$) in either the LED package 26 of FIG. 4 or the LED package 36 of FIG. 5.

Figure 6A:
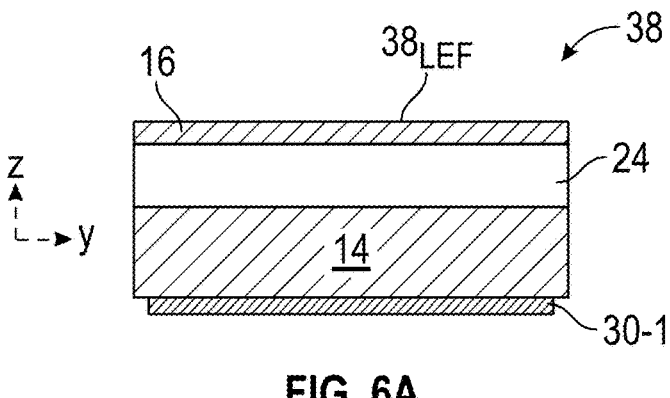
FIG. 6A is a side view of an LED package that is similar to either the LED package of FIG. 4 or the LED package of FIG. 5.
Figure 6B:
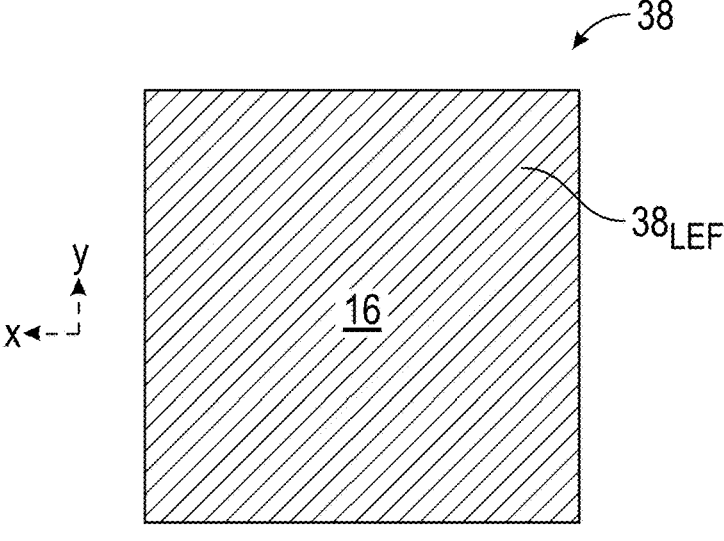
FIG. 6B is a top view of the LED package of FIG. 6A.
Figure 6C:
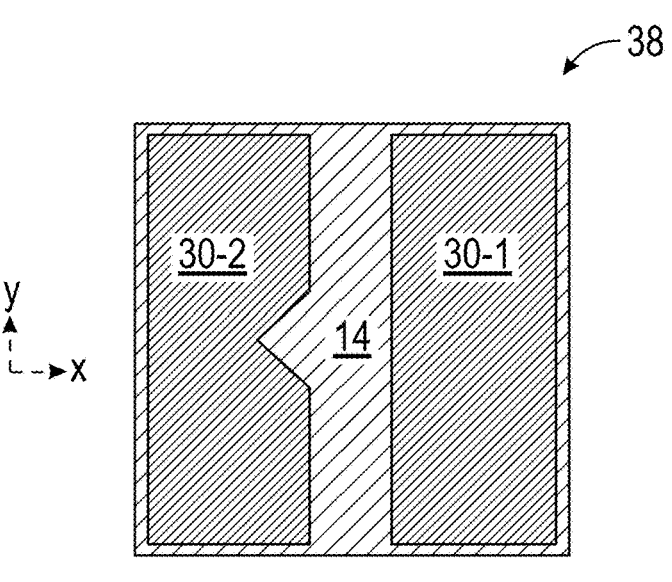
FIG. 6C is a bottom view of the LED package of FIG. 6A.

FIGS. 6A to 6C illustrate various view of an LED package 38 that is similar to either the LED package 26 of FIG. 4 or the LED package 36 of FIG. 5. FIG. 6A is a side view of the LED package 38 illustrating a slim profile thereof. From the side view, portions of the submount 14, the light-altering material 24, and the lumiphoric material layer 16 collectively form peripheral edges of the LED package 38. From this side view, the package bond pad 30-1 is also visible. FIG. 6B is a top view of the LED package 38 of FIG. 6A. Since the lumiphoric material layer 16 is arranged to extend all the way to the peripheral edges of the submount 14, only the lumiphoric material layer 16 is visible from the top view in certain embodiments. In this manner, an exterior light-exiting face $38_{LEF}$ of the lumiphoric material layer 16 is all that is visible. FIG. 6C is a bottom view of the LED package 38 of FIG. 6A illustrating two package bond pads 30-1 to 30-2. In certain embodiments, the package bond pads 30-2 may have a notch or other shape that distinguishes it from the other package bond pad 30-1 to serve as a polarity indicator for proper mounting of the LED package 38.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
   a submount comprising a first side and a second side that opposes the first side, the first side comprising metal traces, and the second side comprising package bond pads that are electrically coupled to the metal traces;
   at least one LED chip including a first side and a second side that is mounted on and electrically coupled to the metal traces; and
   a lumiphoric material layer on the at least one LED chip such that a surface of the lumiphoric material layer forms an exterior light-exiting face for the LED package and a perpendicular distance from the first side of the LED chip to the exterior light-exiting face is no more than 100 microns (µm), and a total height of the LED package as measured from a mounting surface of the package bond pads to the exterior light-exiting face is no more than 900 µm.

2. The LED package of claim 1, wherein the perpendicular distance from the first side of the LED chip to the exterior light-exiting face is in a range from 50 µm to 100 µm.

3. The LED package of claim 1, further comprising a light-altering material on portions of the submount that are adjacent the at least one LED chip, wherein the light-altering material is arranged between the lumiphoric material layer and the submount.

4. The LED package of claim 3, wherein a height of the light-altering material above the submount decreases in a lateral direction away from the at least one LED chip.

5. The LED package of claim 4, wherein the lumiphoric material layer extends on a portion of the light-altering material with the height that decreases in the lateral direction away from the at least one LED chip such that a portion of the lumiphoric material layer is closer to the submount than the first side of the at least one LED chip.

6. The LED package of claim 1, wherein the total height is in a range from 600 μm to 800 μm.

7. The LED package of claim 1, wherein the exterior light-exiting face for the LED package is configured to form an interface with an ambient atmosphere that is separate from the LED package.

8. The LED package of claim 1, wherein the lumiphoric material layer comprises phosphor particles in a binder with a volume percentage of phosphor particles in a range from 25% to 45%.

9. A light-emitting diode (LED) package comprising:

a submount comprising a first side and a second side that opposes the first side, the first side comprising metal traces, and the second side comprising package bond pads that are electrically coupled to the metal traces;

at least one LED chip including a first side and a second side that is mounted on and electrically coupled to the metal traces;

a lumiphoric material layer on the at least one LED chip such that a surface of the lumiphoric material layer forms an exterior light-exiting face for the LED package and a perpendicular distance from the first side of the LED chip to the exterior light-exiting face is no more than 100 microns (μm); and a light-altering material on portions of the submount that are adjacent the at least one LED chip, wherein the light-altering material is arranged between the lumiphoric material layer and the submount and a height of the light-altering material above the submount decreases in a lateral direction away from the at least one LED chip, and wherein the lumiphoric material layer extends on a portion of the light-altering material with the height that decreases in the lateral direction away from the at least one LED chip such that a portion of the lumiphoric material layer is closer to the submount than the first side of the at least one LED chip.

10. The LED package of claim 9, wherein the perpendicular distance from the first side of the LED chip to the exterior light-exiting face is in a range from 50 μm to 100 μm.

11. The LED package of claim 10, wherein a total height of the LED package as measured from a mounting surface of the package bond pads to the exterior light-exiting face is no more than 900 μm.

12. The LED package of claim 11, wherein the total height is in a range from 600 μm to 800 μm.

13. The LED package of claim 9, wherein the exterior light-exiting face for the LED package is configured to form an interface with an ambient atmosphere that is separate from the LED package.

14. The LED package of claim 9, wherein the lumiphoric material layer comprises phosphor particles in a binder with a volume percentage of phosphor particles in a range from 25% to 45%.

* * * * *